US007626204B2

(12) United States Patent
Jeong et al.

(10) Patent No.: US 7,626,204 B2
(45) Date of Patent: Dec. 1, 2009

(54) ORGANIC LIGHT EMITTING DISPLAY AND METHOD OF FABRICATING THE SAME

(75) Inventors: Chang-Yong Jeong, Suwon-si (KR); Tae-Wook Kang, Suwon-si (KR); Chang-Soo Kim, Suwon-si (KR); Sang-Il Park, Suwon-si (KR); Keun-Soo Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 37 days.

(21) Appl. No.: 11/011,478

(22) Filed: Dec. 13, 2004

(65) Prior Publication Data

US 2005/0285100 A1 Dec. 29, 2005

(30) Foreign Application Priority Data

Jun. 28, 2004 (KR) .................. 10-2004-0049163

(51) Int. Cl.
*H01L 27/15* (2006.01)
(52) U.S. Cl. .................. 257/72; 257/59; 257/E27.112
(58) Field of Classification Search .................. 257/59, 257/72, 347, 350, E27.111–E27.112, E29.276; 438/149
See application file for complete search history.

(56) References Cited

U.S. PATENT DOCUMENTS

| 6,630,785 | B1 * | 10/2003 | Lu | 313/505 |
|---|---|---|---|---|
| 6,888,304 | B2 * | 5/2005 | Sato | 313/498 |
| 2002/0140643 | A1 * | 10/2002 | Sato | 345/76 |
| 2003/0089991 | A1 * | 5/2003 | Yamazaki et al. | 257/759 |
| 2003/0164489 | A1 * | 9/2003 | Gotoh et al. | 257/10 |
| 2003/0193054 | A1 * | 10/2003 | Hayakawa et al. | 257/72 |
| 2003/0201716 | A1 * | 10/2003 | Yamazaki et al. | 313/506 |
| 2004/0051445 | A1 * | 3/2004 | Adachi | 313/504 |
| 2004/0229466 | A1 * | 11/2004 | Ishikawa et al. | 438/689 |
| 2005/0001963 | A1 * | 1/2005 | Yokoyama | 349/122 |

(Continued)

FOREIGN PATENT DOCUMENTS

JP 2001-110575 4/2001

(Continued)

OTHER PUBLICATIONS

Japanese Office Action dated Jan. 8, 2008 in Japanese Patent Application No. 2004-377849, noting references listed in this IDS.

(Continued)

*Primary Examiner*—Douglas M Menz
*Assistant Examiner*—Matthew W Such
(74) *Attorney, Agent, or Firm*—Christie, Parker & Hale, LLP

(57) ABSTRACT

An organic light emitting display and method of fabricating the same are provided. The organic light emitting display includes: a TFT disposed on a substrate and having a gate electrode and source and drain electrodes; a pixel electrode formed on a planarization layer having a via contact hole over the substrate, connected to one of the source and drain electrodes through the via contact hole, and having an etching surface extending to the planarization layer; a pixel defining layer pattern for defining an emission region formed on the entire surface; an organic layer formed on an emission region of the pixel electrode, and having at least an emission layer; and an opposite electrode formed on the entire surface, thereby preventing the organic layer from being separated from an edge of the pixel electrode and a short circuit from occurring between the pixel electrode and the opposite electrode to improve device characteristics and reliability.

8 Claims, 4 Drawing Sheets

U.S. PATENT DOCUMENTS

2005/0093438 A1* 5/2005 Chen .................. 313/506

FOREIGN PATENT DOCUMENTS

| | | |
|---|---|---|
| JP | 2002-83689 | 3/2002 |
| JP | 2002-216946 | 8/2002 |
| JP | 2003-332072 | 11/2003 |
| WO | WO 97/34447 | 9/1997 |

OTHER PUBLICATIONS

Patent Abstracts of Japan, Publication No. 2002-083689 dated Mar. 22, 2002, Yamagata et al.

Patent Abstracts of Japan, Publication No. 2002-216946 dated Aug. 2, 2002, Yoshinori Sen.

Patent Abstracts of Japan, Publication No. 2003-332072 dated Nov. 21, 2003, Sato et al.

Patent Abstracts of Japan, Publication No. 2001-110575 dated Apr. 20, 2001, Suzuki et al.

* cited by examiner

ORGANIC LIGHT EMITTING DISPLAY AND METHOD OF FABRICATING THE SAME

CROSS-REFERENCE TO RELATED APPLICATION

This application claims priority to and the benefit of Korean Patent Application No. 10-2004-49163, filed Jun. 28, 2004, the disclosure of which is hereby incorporated herein by reference in its entirety.

FIELD OF THE INVENTION

The present invention relates to an organic light emitting display and method of fabricating the same and, more particularly, to an organic light emitting display and a method of fabricating the same capable of facilitating the following process by extending an etching surface of an edge of a pixel electrode to a planarization layer under the pixel electrode.

BACKGROUND OF THE INVENTION

Generally, an organic light emitting display (hereinafter, referred to as OLED) is an emissive display device emitting light by electrically exciting a fluorescent organic compound. OLEDs may be classified as a passive matrix type and an active matrix type depending on how the pixels arranged in an N×M matrix are driven. An active matrix OLED has advantages in that it can be used for a large screen and high-resolution display since it has low power consumption compared to a passive matrix OLED. In addition, OLEDs may be classified as top emission type, bottom emission type, and double-sided emission type depending on the direction light is emitted from the organic compound. A top emission OLED has an advantage of a high aperture ratio for a device emitting light in the reverse direction from the substrate including the unit pixels, unlike a bottom emission OLED.

The organic compound for emitting the OLED is formed at an emission region of a pixel electrode which is an anode. The organic compound is formed by a laser-induced thermal imaging (LITI) method, a low molecular deposition method, or the like.

FIG. 1 is a cross-sectional view illustrating a conventional OLED, which will be briefly described with reference to a method of fabricating the same.

First, a buffer layer 110 is formed to a predetermined thickness on a substrate 100, and then a thin film transistor (TFT) including a polysilicon pattern 120, a gate electrode 132, and source and drain electrodes 150 and 152 is formed. At this time, source and drain regions 122, in which impurities are implanted, are formed at both sides of the polysilicon pattern 120, and a gate insulating layer 130 is formed on an entire surface including the polysilicon pattern 120. An interlayer dielectric 140 is formed over the gate electrode 132 and the gate insulating layer 130.

Next, a passivation layer 160 is formed to a predetermined thickness on the entire surface, and then the passivation layer 160 is etched by an etching process to form a first via contact hole 162 for exposing at least one of the source and drain electrodes 150 and 152, for example, the drain electrode 152. The passivation layer 160 is made of an inorganic insulating layer such as a silicon nitride layer, a silicon oxide layer, or a stacked structure thereof.

Then, a planarization layer 170 is formed on the entire surface of the structure. The planarization layer 170 may be formed of a material selected from the group consisting of polyimides, benzocyclobutene-based resins, spin on glass (SOG), and acrylates, which is formed to planarize the emission region.

Continuously, the planarization layer 170 is etched by photolithography and etching processes to form a second via contact hole 172 for exposing the first via contact hole 162.

Next, a thin layer (not shown) for forming a pixel electrode 180 is formed. The thin layer is formed to a thickness of about 10~1500 Å using a transparent metal material such as ITO (indium tin oxide).

Next, the thin layer is etched by photolithography and etching processes to form a pixel electrode 180. In this process, when a reflection layer is formed under the pixel electrode 180, a top emission OLED is formed. On the other hand, when the reflection layer is formed in forming the opposite electrode, a bottom emission OLED is formed. The thickness of the thin layer for the pixel electrode may also be varied depending upon the kind of OLED.

Then, a pixel defining layer pattern 190 for defining the emission region is formed on the entire surface of the structure. The pixel defining layer pattern 190 may be formed of a material selected from the group consisting of polyimides, benzocyclobutene-based resins, phenol-based resins, and acrylates.

Subsequently, an organic layer 192 including at least one emission layer is formed on a pixel region defined by the pixel defining layer pattern 190 using a low molecular deposition method or an LITI method. Then, an opposite electrode 194 is formed to complete the OLED. At this time, for a top emission OLED, the opposite electrode is formed of a transparent electrode or a transparent metal electrode, and in the case of a bottom emission OLED, the opposite electrode is formed of a metal electrode having a reflection layer or a reflection electrode.

In the method of fabricating an OLED in accordance with the conventional art as described above, the thin layer for the pixel electrode uses a transparent metal thin layer such as ITO or IZO, and it is advantageous to form the pixel defining layer to a thickness of not more than 3000 Å. Here, while it is impossible to wet-etch polycrystalline ITO among ITO materials used for the thin layer for the pixel electrode, amorphous ITO can be wet etched. However, an etching surface of the amorphous ITO has a vertical or undercut portion to form a step at an edge of the pixel electrode as shown in (x) portion of FIG. 1. As a result, there is a high probability that a lower portion of the etching surface of the pixel electrode is not buried in the following process of forming the pixel defining layer, and the pixel defining layer may be damaged by pressure applied when the organic layer including the emission layer is formed. The damage to the pixel defining layer may cause a short-circuit between the pixel electrode and the opposite electrode, increasing the chance of failure of the device, and thereby lowering the yield. In addition, the pixel defining layer is formed to have a small thickness at an upper portion of the etching surface of the pixel electrode to cause an electric field to be concentrated between an upper portion of an edge of the pixel electrode having a vertical etching surface and the opposite electrode, thereby deteriorating the organic layer and reducing the lifetime of the OLED.

SUMMARY OF THE INVENTION

One embodiment of the present invention solves the aforementioned problems associated with conventional devices by providing an OLED and method of fabricating the same capable of facilitating the following process and therefore improving device reliability by etching a thin layer for a pixel electrode using a dry etching process, especially, performing an overetch process to form a pixel electrode, and simultaneously etching to a planarization layer having a predetermined thickness to thereby extend the etching surface of the pixel electrode up to the planarization layer.

In an exemplary embodiment of the present invention, an OLED includes: a TFT disposed on a substrate and having a gate electrode and source and drain electrodes; a pixel electrode formed on a planarization layer having a via contact hole over the substrate connected to one of the source and drain electrodes through the via contact hole, and having an etching surface extending to the planarization layer; a pixel defining layer pattern for defining an emission region formed on the entire surface; an organic layer formed on the emission region of the pixel electrode, and having at least an emission layer; and an opposite electrode formed on the organic layer, wherein the planarization layer is formed of a material selected from the group consisting of polyimides, benzocyclobutene-based resins, spin on glass (SOG), and acrylates; the pixel electrode is made of a transparent electrode, or a stacked structure of a transparent electrode and a reflection layer; an etching surface of the pixel electrode has an angle of about 10~60° from the horizontal plane; the planarization layer extending to the etching surface of the pixel electrode has an angle of 20~60° from the horizontal plane defined by the planarization layer; the planarization layer has a step of about 10~1000 Å; the pixel defining layer pattern has a thickness of about 1000~3000 Å; and the opposite electrode is made of a stacked structure of the transparent electrode and the reflection layer or the reflection electrode.

In another exemplary embodiment according to the present invention, a method of fabricating an OLED includes: forming a planarization layer on a substrate at which a TFT having a gate electrode and source and drain electrodes is formed; etching the planarization layer using photolithography and etching processes to form a via contact hole for exposing one of the source and drain electrodes; forming a thin layer for a pixel electrode on the entire surface; etching the thin layer for the pixel electrode using a dry etching process to form a pixel electrode connected to one of the source and drain electrodes, the etching process simultaneously overetching the planarization layer and removing a predetermined thickness; forming a pixel defining layer pattern for defining an emission region on the entire surface; forming an organic layer having at least an emission layer on the emission region of the pixel electrode; and forming an opposite electrode on the organic layer, wherein the planarization layer is formed of a material selected from the group consisting of polyimides, benzocyclobutene-based resins, spin on glass (SOG), and acrylates. The pixel electrode is made of a transparent electrode, or a stacked structure of a transparent electrode and a reflection layer; the dry etching process is performed by an ICP or RIE method; the dry etching process is performed under conditions of a pressure of about 0.4~0.7 Pa, a source power of about 2000~3000 W, a bias power of about 700~1700 W, and a flow rate of $Cl_2$ of about 50~150 sccm; the etching surface of the pixel electrode has an angle of about 10~60° from a horizontal plane defined by the planarization layer; the etching surface of the planarization layer extending to the etching surface of the pixel electrode has an angle of 20~60° from the horizontal plane; the etching process is performed to remove the planarization layer to a thickness of about 10~1000 Å; the pixel defining layer pattern is formed to a thickness of 1000~3000 Å; and the opposite electrode is made of a stacked structure of the transparent electrode and the reflection layer or the reflection electrode.

BRIEF DESCRIPTION OF THE DRAWINGS

The above and other features of the present invention will be described in reference to certain exemplary embodiments thereof with reference to the attached drawings in which.

DETAILED DESCRIPTION

Hereinafter, an embodiment of the present invention will be described with reference to the accompanying drawings.

Figure 1:
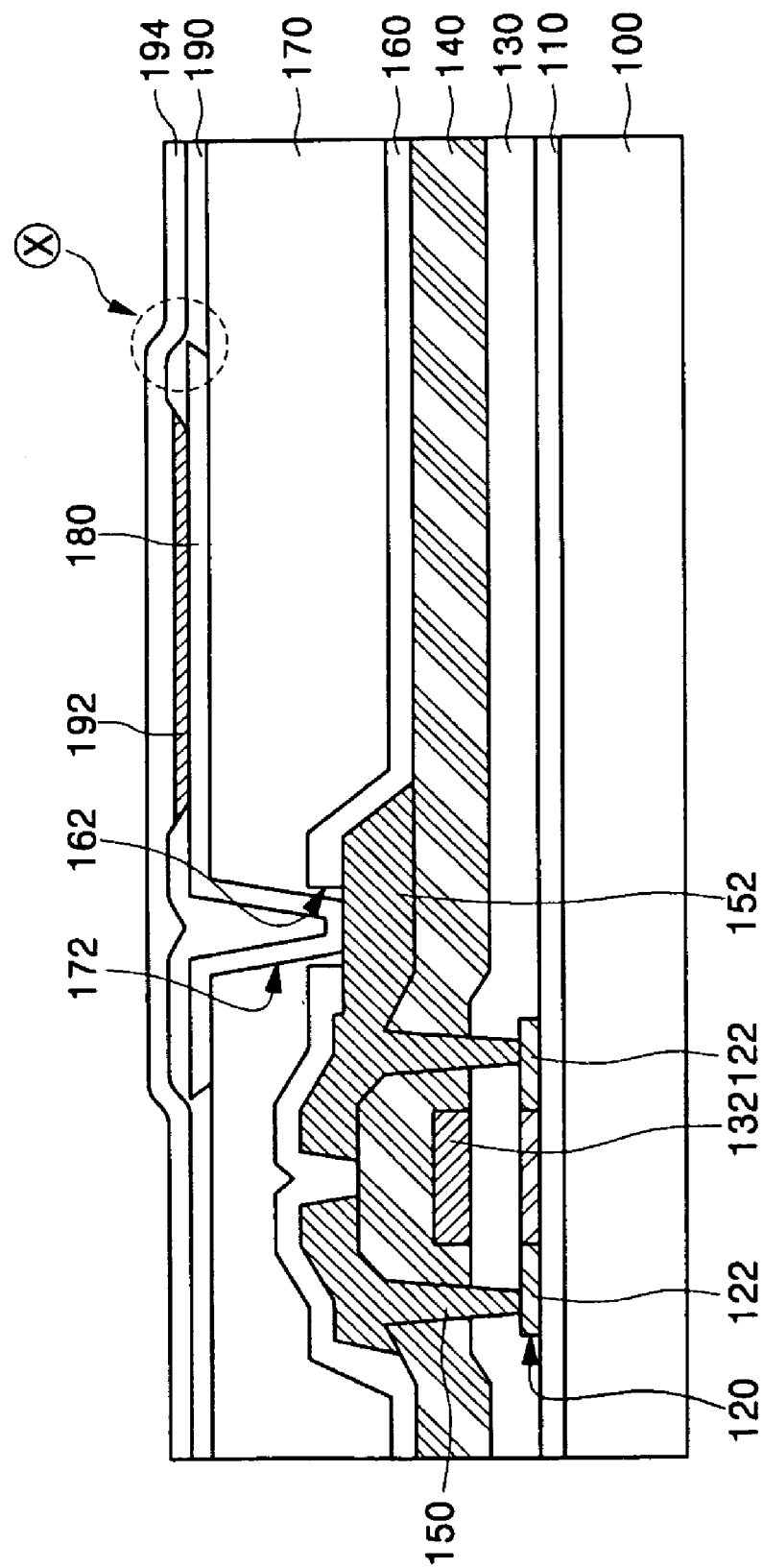
FIG. 1 is a cross-sectional view of a conventional OLED.
Figure 2:
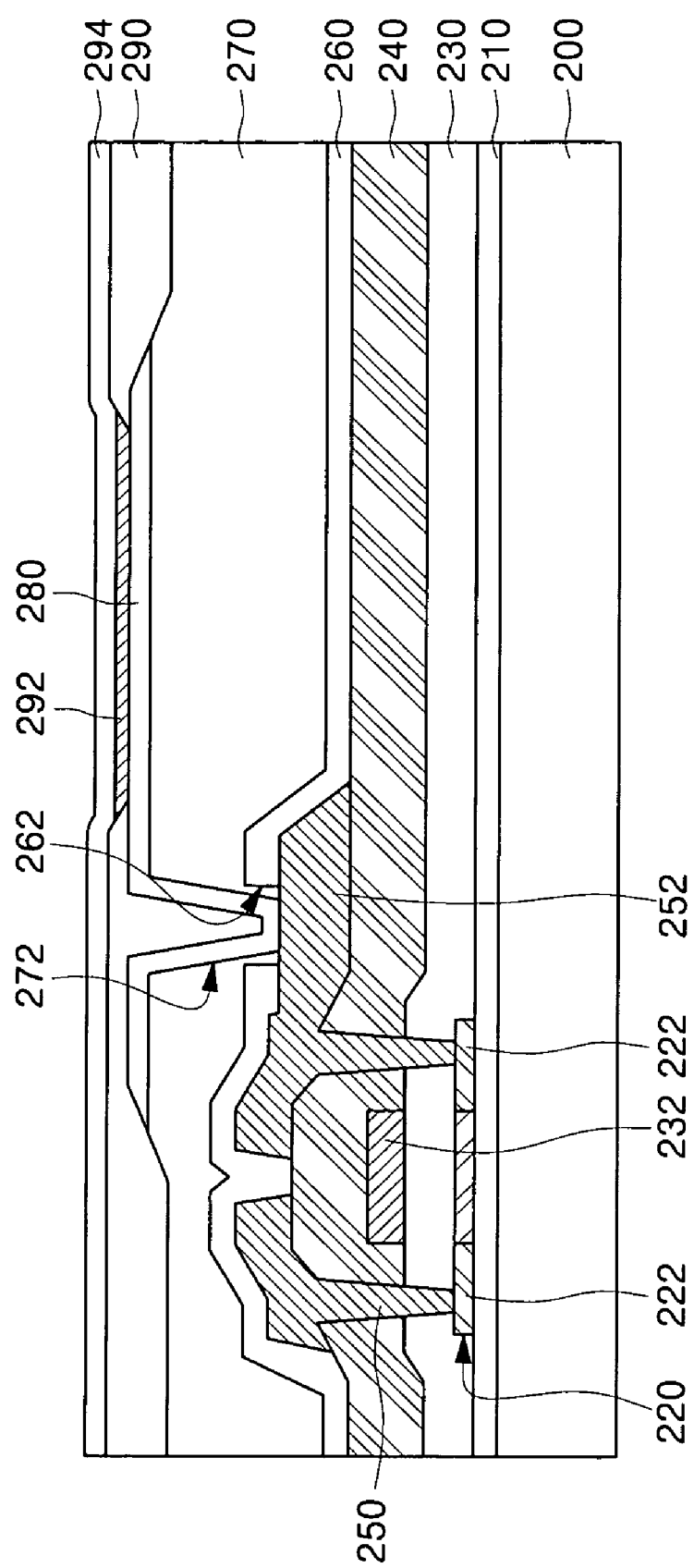
FIG. 2 is a cross-sectional view of an OLED in accordance with the present invention.
Figure 3:
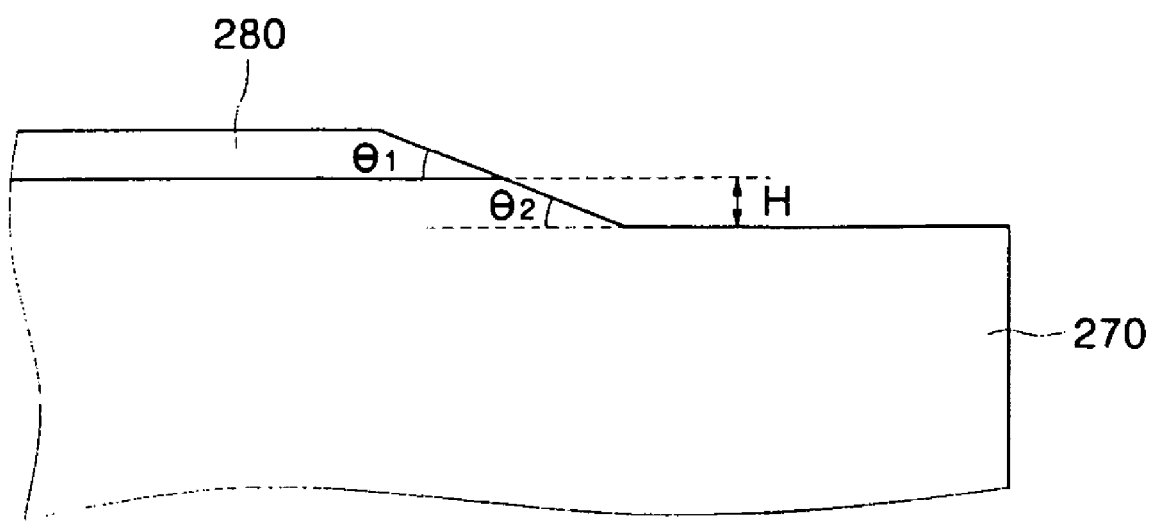
FIG. 3 is a schematic cross-sectional view illustrating an edge etching profile of a pixel electrode constituting the OLED shown in FIG. 2.

FIG. 2 is a cross-sectional view of an OLED in accordance with the present invention, and FIG. 3 is a schematic cross-sectional view illustrating an edge etching profile of a pixel electrode constituting the OLED shown in FIG. 2, which will be described with reference to each other.

First, a buffer layer 210 is formed to a predetermined thickness on a substrate 200, and a TFT including a polysilicon pattern 220, a gate electrode 232, and source and drain electrodes 250 and 252 is formed. At this time, source and drain regions 222, in which impurities are implanted, are formed at both sides of the polysilicon pattern 220, and a gate insulating layer 230 is formed on the entire surface including the polysilicon pattern 220. An interlayer dielectric 240 is formed over the gate electrode 232 and the gate insulating layer 230.

Next, a passivation layer 260 is formed to a predetermined thickness on the entire surface, and then etched to form a first via contact hole 262 for exposing at least one of the source and drain electrodes 250 and 252, for example, the drain electrode 252. The passivation layer 260 is made of an inorganic insulating layer such as a silicon nitride layer, a silicon oxide layer, or a stacked structure thereof.

Then, a planarization layer 270 is formed on the entire surface. The planarization layer 270 may be formed of a material selected from the group consisting of polyimides, benzocyclobutene-based resins, spin on glass (SOG), and acrylates, which is formed to planarize the emission region.

Continuously, the planarization layer 270 is etched by photolithography and etching processes to form a second via contact hole 272 for exposing the first via contact hole 262.

Next, a thin layer (not shown) for forming a pixel electrode is formed. The thin layer is formed to a thickness of about 10~1500 Å using a transparent metal material such as ITO (indium tin oxide).

Next, the thin layer is etched by the photolithography and etching processes to form a pixel electrode 280. At this time, the etching process uses a dry etching process, which is simultaneously performed to remove the planarization layer 270 having a predetermined thickness. The dry etching process is performed by an inductive coupled plasma (ICP) or reactive ion etching (RIE) method using plasma to cause the etching surfaces of the pixel electrode 280 and the planarization layer 270 to be inclined. The dry etching process is performed under conditions of a pressure of about 0.4~0.7 Pa, a source power of about 2000~3000 W, a bias power of about 700~1700 W, and a flow rate of $Cl_2$ of about 50~150 sccm.

Referring to FIG. 3, the etched surface of the pixel electrode 280 formed by the etching process has an angle θ 1 of about 10~60° to the horizontal plane, and the etched surface of the planarization layer 270 has an angle θ 2 of 20~60° to the horizontal plane. The reason for this is that a pixel defining layer, an organic layer and an opposite layer, which are formed by the following processes, are readily formed. In particular, by removing the step around an edge of the pixel electrode, the pixel electrode is formed to have a uniform thickness to prevent a short circuit from occurring between the pixel electrode 280 and the opposite electrode.

A thickness (H) of the planarization layer 270 removed by the excessive etching is about 10~1000 Å.

Figure 4:
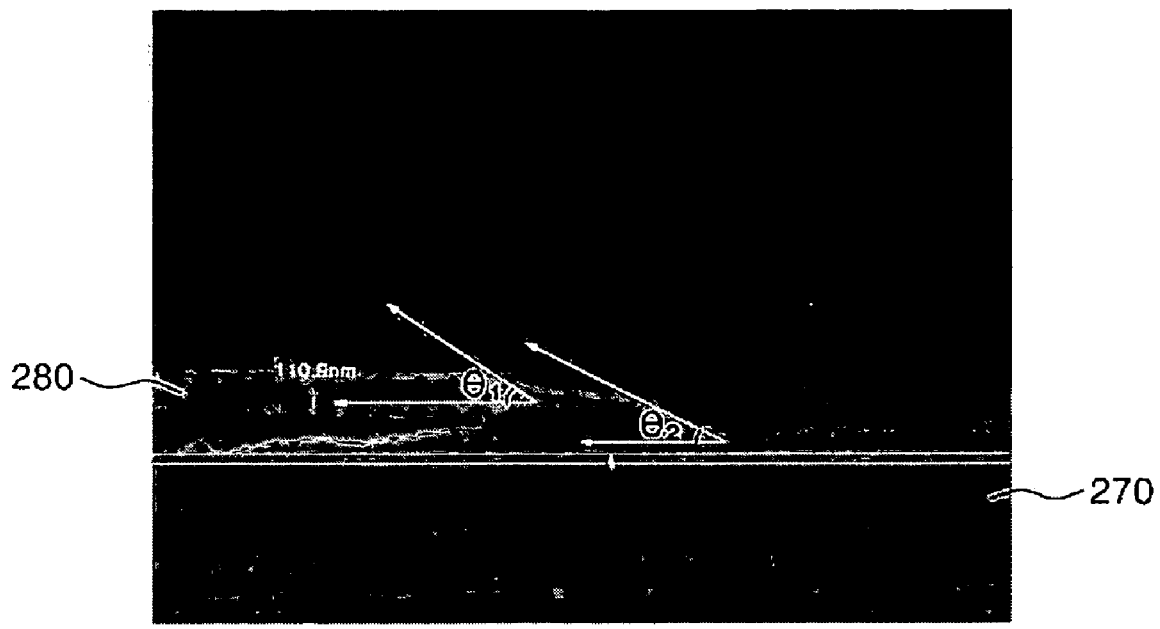
FIG. 4 shows a photograph of an OLED in accordance with the present invention.

FIG. 4 shows a photograph of an OLED in accordance with the present invention. Referring to FIG. 4, the angle θ 1 of the etched surface of the pixel electrode 280 to the horizontal plane and the angle θ 2 of the etched surface of the planarization layer 270 to the horizontal plane are formed to have angles of 50° and 30°, respectively.

Meanwhile, when a reflection layer is formed under the pixel electrode 280, the top emission OLED is formed, and when the reflection layer is formed in the following process of forming the opposite electrode, the bottom emission OLED is formed.

Referring back to FIG. 2, a pixel defining layer pattern 290 for defining an emission region is then formed on the entire surface. The pixel defining layer pattern 290 is made of a material selected from the group consisting of polyimides, benzocyclobutene-based resins, phenol-based resins, and acrylates, and is formed to a thickness of about 1000~3000 Å. This is advantageous to the formation of an organic layer using a laser-induced thermal imaging (LITI) method. That is, the step around the edge of the emission region is reduced to prevent the organic layer from being cut or separated therefrom.

Subsequently, an organic layer 292 including at least an emission layer is formed on the pixel region defined by the pixel defining layer pattern 290 through a low molecular deposition method or an LITI method. Then, an opposite electrode 294 is formed to complete the OLED. At this time, when the OLED is a top emission OLED, the opposite electrode is formed of a transparent electrode or a transparent metal electrode, and when the OLED is a bottom emission OLED, the opposite electrode is formed of a metal electrode including a reflection layer or a reflection electrode.

As can be seen from the foregoing, the present invention provides an OLED and method of fabricating the same capable of facilitating the following process and therefore improving device reliability by etching a thin layer for a pixel electrode using a dry etching process, especially, performing an overetching process to form a pixel electrode, and simultaneously etching to a planarization layer having a predetermined thickness to thereby extend the etching surface of the pixel electrode up to the planarization layer.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:
1. An organic light emitting display (OLED) comprising:
a thin film transistor (TFT) on a substrate and having a gate electrode and source and drain electrodes;
a pixel electrode on a planarization layer having a via contact hole over the substrate, connected to one of the source and drain electrodes through the via contact hole, and having a pixel electrode surface extending to a planarization surface of the planarization layer, said pixel electrode surface of the pixel electrode and said planarization surface of the planarization layer inclining down and away from at least two sides of the via contact hole;
a pixel defining layer pattern for defining an emission region of the pixel electrode over the substrate;
an organic layer on the emission region of the pixel electrode, and having at least an emission layer; and
an opposite electrode over the substrate,
wherein said pixel electrode surface is at an edge of the pixel electrode, and is flush and co-planar with said planarization surface.
2. The OLED according to claim 1, wherein the planarization layer is formed of a material selected from the group consisting of polyimides, benzocyclobutene-based resins, spin on glass (SOG), and acrylates.
3. The OLED according to claim 1, wherein the pixel electrode is a transparent electrode, or a stacked structure of a transparent electrode and a reflection layer.
4. The OLED according to claim 1, wherein the pixel electrode surface having an angle of about 10 to 60° from a horizontal plane defined by another surface of the planarization layer, the another surface being parallel to a surface of the substrate facing the planarization layer.
5. The OLED according to claim 1, wherein the planarization layer has a step of about 10 to 1000 Å.
6. The OLED according to claim 1, wherein the pixel defining layer pattern has a thickness of about 1000 to 3000 Å.
7. The OLED according to claim 1, wherein the opposite electrode is made of a reflection electrode or a stacked structure of a transparent electrode and a reflection layer.
8. An organic light emitting display (OLED) comprising:
a thin film transistor (TFT) on a substrate and having a gate electrode and source and drain electrodes;
a pixel electrode on a planarization layer having a via contact hole over the substrate, connected to one of the source and drain electrodes through the via contact hole, and having a pixel electrode surface extending to a planarization surface of the planarization layer, said pixel electrode surface of the pixel electrode and said planarization surface of the planarization layer inclining down and away from at least two sides of the via contact hole;
a pixel defining layer pattern for defining an emission region of the pixel electrode over the substrate;
an organic layer on the emission region of the pixel electrode, and having at least an emission layer; and
an opposite electrode over the substrate,
wherein said planarization surface of the planarization layer has an angle of 20 to 60° from a horizontal plane defined by another surface of the planarization layer, the another surface being parallel to a surface of the substrate facing the planarization layer, and
wherein said pixel electrode surface is at an edge of the pixel electrode, and is flush and co-planar with said planarization surface.

* * * * *